(12) United States Patent
Mueller

(10) Patent No.: US 7,325,087 B2
(45) Date of Patent: *Jan. 29, 2008

(54) USING A PROCESSOR TO PROGRAM A SEMICONDUCTOR MEMORY

(75) Inventor: Peter D. Mueller, Fair Oaks, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 11/499,340

(22) Filed: Aug. 4, 2006

(65) Prior Publication Data

US 2006/0288126 A1    Dec. 21, 2006

Related U.S. Application Data

(63) Continuation of application No. 10/744,035, filed on Dec. 23, 2003, now Pat. No. 7,099,985.

(51) Int. Cl.
*G06F 13/40* (2006.01)

(52) U.S. Cl. .................................. 710/307; 710/305
(58) Field of Classification Search ................ 710/307, 710/305, 313; 711/143; 713/600
See application file for complete search history.

(56) References Cited

U.S. PATENT DOCUMENTS

| 5,594,877 A * | 1/1997 | Lentz et al. ................ 710/307 |
| 5,860,112 A * | 1/1999 | Langendorf et al. ........ 711/143 |
| 2005/0050375 A1* | 3/2005 | Novak et al. ............... 713/600 |

* cited by examiner

*Primary Examiner*—Vu A. Le

(57) ABSTRACT

A memory programmer may be coupled through a first processor and a physical interface to a semiconductor memory to be programmed. The interface may be the same interface that allows two separate processors in a multiprocessor memory to communicate with one another in one embodiment. Thus, an independent memory bus coupled directly to the memory components to be programmed may be eliminated, reducing form factor, decreasing costs, and increasing manufacturing throughput in some embodiments of the present invention.

8 Claims, 5 Drawing Sheets

USING A PROCESSOR TO PROGRAM A SEMICONDUCTOR MEMORY

CROSS-REFERENCE TO RELATED APPLICATION

This application is a continuation of U.S. patent application Ser. No. 10/744,035, filed on Dec. 23, 2003 now U.S. Pat. No. 7,099,985.

BACKGROUND

This invention relates generally to programming semiconductor memories.

Many microprocessors are utilized in embedded applications, such as automobile systems, stereo systems, watches, personal digital assistants, a variety of smart industrial machines, and smart telephones, to mention a few examples. In many of these embedded applications, microprocessors need to exchange large amounts of data with other microprocessors, system level peripherals, and external servers. In addition, a large amount of data of different types may be exchanged from processors, including both command and control information, databases, streaming data, and large file transfers.

A high speed serial link may be utilized to enable communications between embedded processors. One such high speed link is called the Mobile Scalable Link (MSL) available from Intel Corporation, Santa Clara, Calif. The MSL may reduce the bottleneck of data exchanged between general purpose application processors and baseband processors in next-generation hand held mobile devices such as smart phones and personal digital assistants. A number of semiconductor memories may be coupled to application processors.

Generally those memories are programmed through a memory bus coupled directly to the packaging for the integrated semiconductor memory. The memory bus includes a large number of pins, increasing the size of the integrated circuit package for the memory and the cost of the overall system.

Thus, there is a need for alternate ways to program semiconductor memories in processor-based integrated circuit systems.

DETAILED DESCRIPTION

Figure 1:
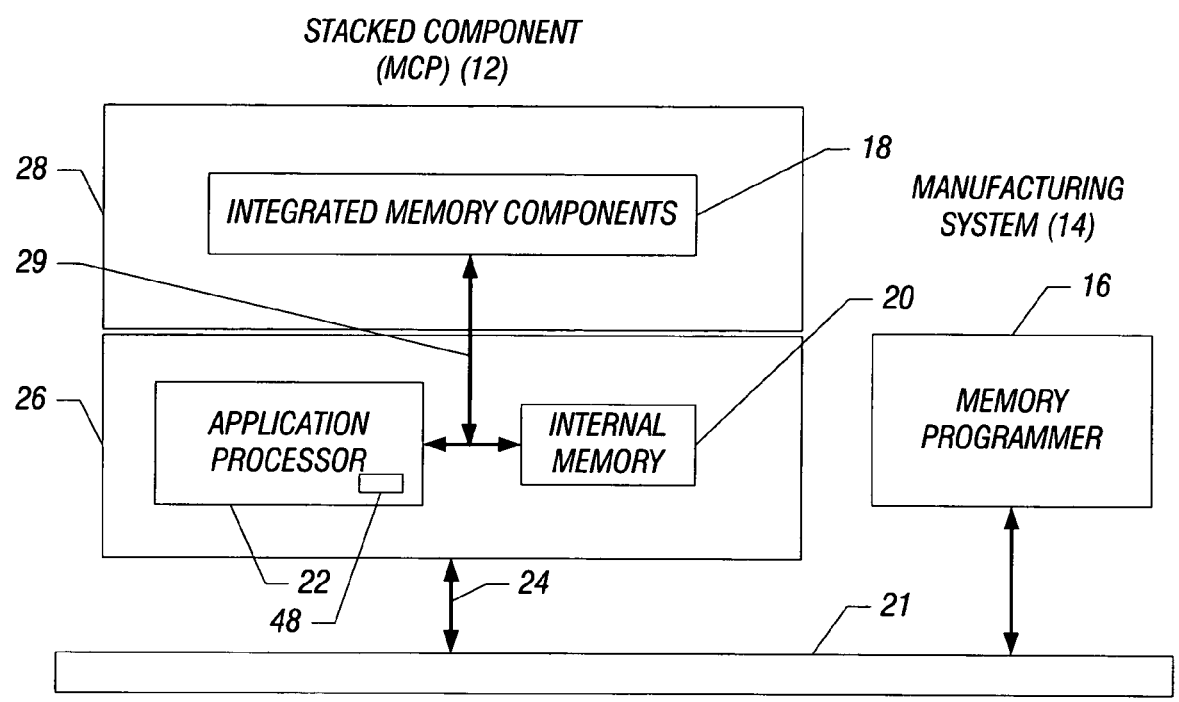
FIG. 1 is a system depiction of one embodiment of the present invention.

Referring to FIG. 1, a system 10 may be a mobile embedded system in one embodiment of the present invention. The system 10 may include an application or general purpose processor 22 coupled through a physical interface 24 to a board or socket 21. The processor 22 may be an embedded processor in one embodiment.

In some embodiments, a second processor, not shown in FIG. 1, may be coupled to that board or socket 21. In one implementation of the present invention, the application processor 22 may operate through the interface 24 to exchange data with an onboard or in-socket baseband processor not shown in FIG. 1. Applications for such systems include smart telephones, cell phones, and personal digital assistants, to mention a few examples.

The application processor 22 may be an integrated circuit with internal memory 20 in one embodiment of the present invention. The application processor 22 and internal memory 20 may communicate with an integrated memory component 18. Thus, a stacked component or multi-component package (MCP) 12 may include the packaged integrated circuits 26 and 28 in one embodiment of the present invention.

The integrated memory components 18 may be stacked flash memory integrated circuits in one embodiment of the present invention. However, other non-volatile or volatile semiconductor memories may also be used, including electrically eraseable read only memory, polymer memory, ovonic, or phase change memory, and static random access memory, to mention a few examples.

The integrated circuits 26 and 28 may be separately packaged in one embodiment. In another embodiment, the circuits 26 and 28 are contained within the same package. In still other embodiments, the components 18 and 22 may be part of the same integrated circuit. In some cases, the board or socket 21 may not be used.

The integrated memory components 18 would have been programmed conventionally by connecting a memory bus (not shown) from the components 18 to a memory programmer 16 that may be part of a manufacturing system 14. However, such a memory bus commonly uses around 50 pins. This increases the form factor of the package for the components 18 and thereby increases cost.

However, in the system 10 shown in FIG. 1, the memory programmer 16, which may be part of a manufacturing system 14, may be plugged into the board or socket 21 to communicate with the integrated memory components 18 through the application processor 22 and its physical interface 24. Thus, the memory programmer 16 may program the components 18 indirectly through the application processor 22. Effectively, in one embodiment, the application processor 22 may handle high speed data from the interface 24, buffer that data, and then feed the buffered data, at a slower rate, to the memory to be programmed.

In some embodiments of the present invention, software 48 may be executed by the application processor 22 to facilitate the programming of the components 18. As a result, it is no longer necessary to couple a memory bus to the components 18. Instead, a memory bus connection 29 may be established between the processor 22 and the component 18. In some embodiments, this may reduce form factor, decrease cost, and increase programming speed, which reduces manufacturing program time. Increasing programming speed may increase manufacturing throughput and further decrease costs in some embodiments.

Figure 2:
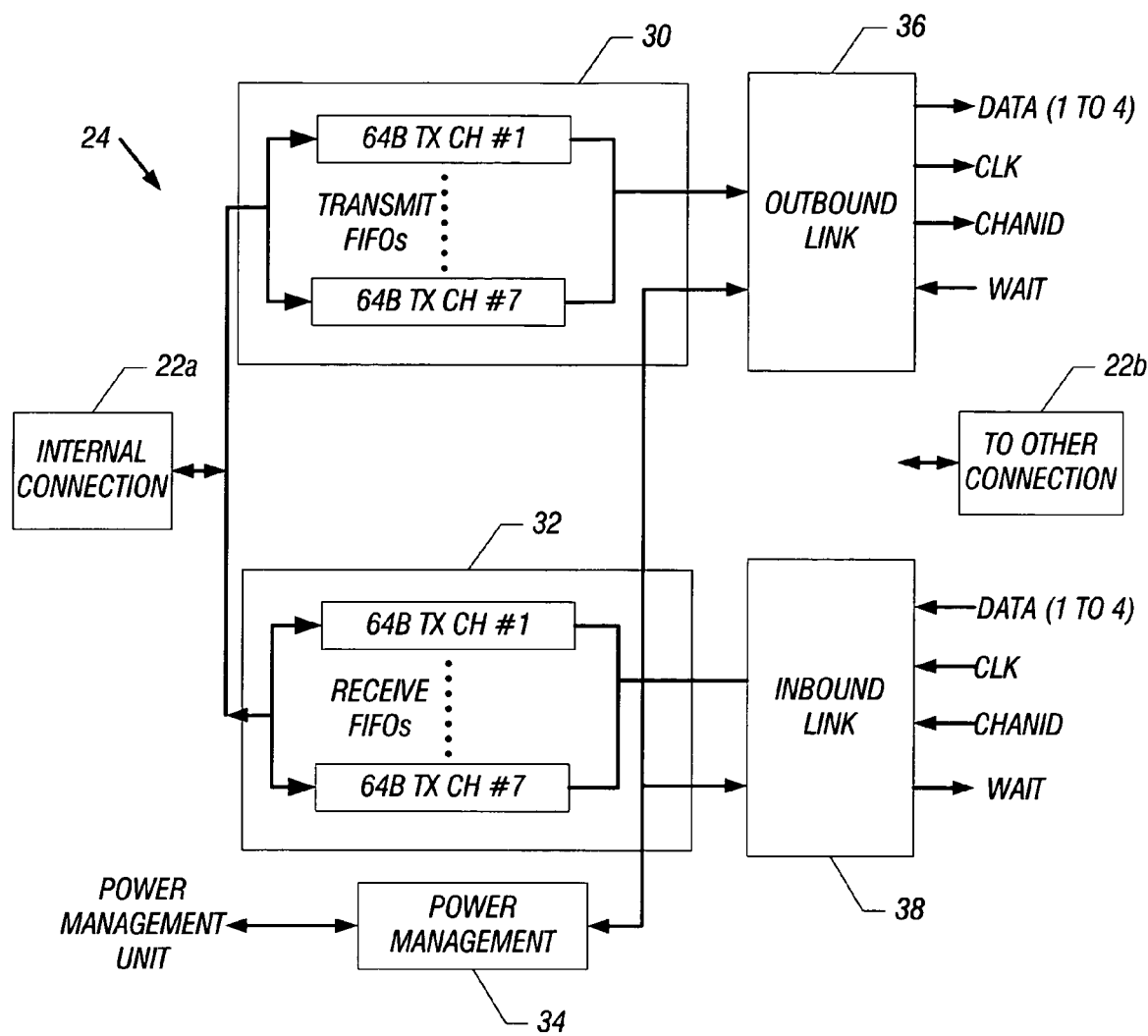
FIG. 2 is a schematic depiction of one embodiment of the serial link shown in FIG. 1 in accordance with one embodiment of the present invention.

Referring next to FIG. 2, the physical interface 24 may be a high speed, high bandwidth serial link that, in one embodiment, may be the Mobile Scalable Link from Intel Corporation. As another example, the interface 24 may be one compliant with the Universal Serial Bus Revision 2.0 specification (Apr. 27, 2000) available from the USB Implementers Forum, Inc., Portland, Oreg. 97221. The interface 24 may couple the application processor 22 with a baseband processor (not shown). For example, in one embodiment, the application processor 22 may include a processor internal connection 22a and the board 21 may have a similar connection 22b.

The interface 24, in one embodiment, may include a pair of unidirectional, high speed links 36 and 38 for connecting two nodes made up of connections 22a and 22b.

Transmit first-in-first-out (FIFO) buffers 30 may couple to an outbound link 36 and to the internal connection 22a in one embodiment. An inbound link 38 may couple to the receive first-in-first-out (FIFO) buffers 32 to the internal connection 22a. Each link 36 and 38 may receive a clock signal, one to four data channels, a channel identifier, and a wait pin, as indicated by FIG. 2. While a hardware depiction for the interface 24 is illustrated, the present invention is in no way limited to a particular hardware architecture.

Figure 3:
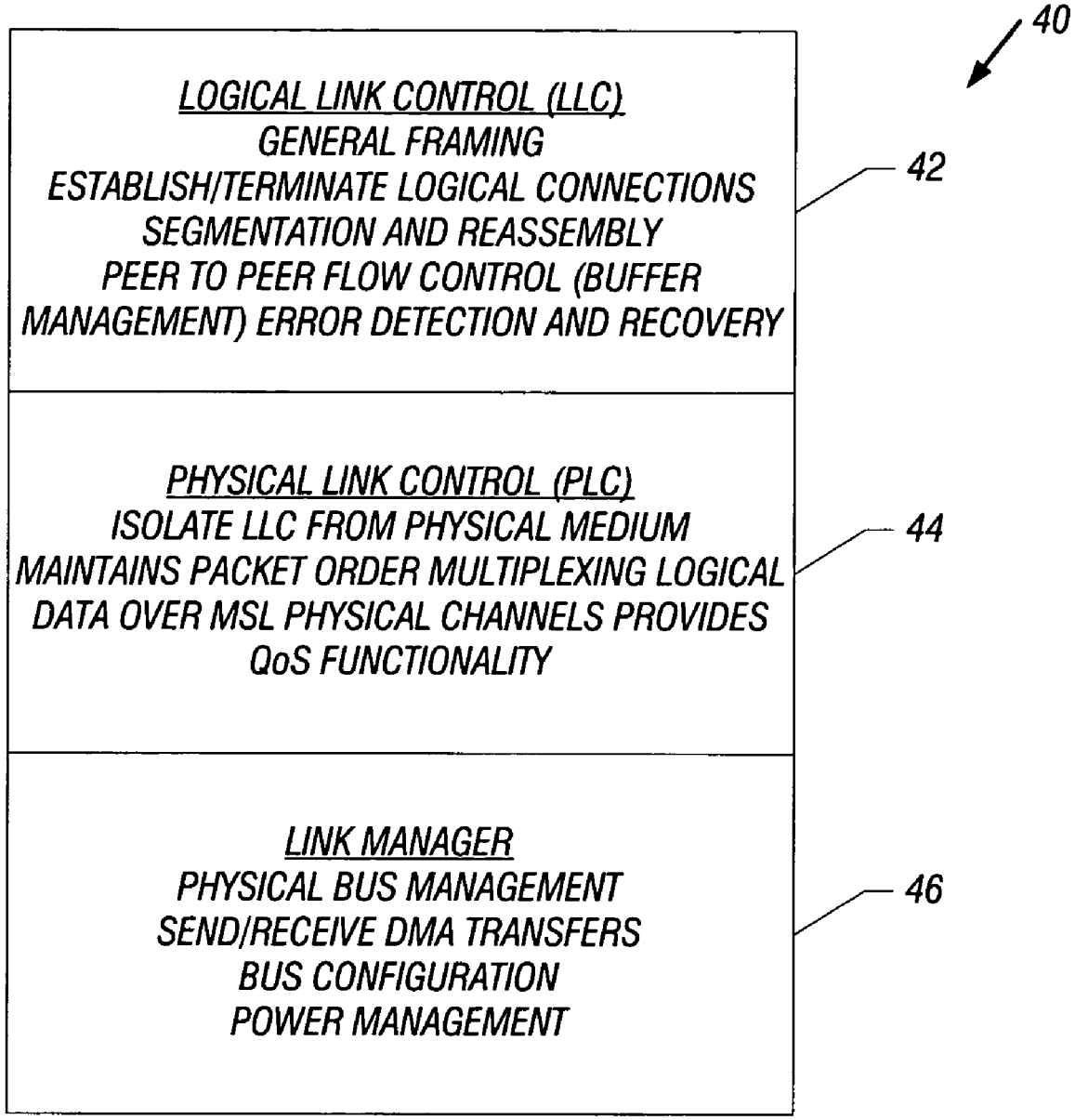
FIG. 3 is a software stack for one embodiment of the serial link shown in FIG. 1.

Referring to FIG. 3, a software stack for the interface 24 may be logically divided into three layers 42, 44, and 46 in one embodiment. The logical link control layer 42 may provide general framing to higher layer packets and may help establish connections between nodes. The physical link control layer 44 may multiplex higher layer packets over the available interface physical channels and provide quality of service functionality. The physical link manager layer 46 may interface with low level platform elements, like direct memory access and interrupts, and may help in actual data transfer. The physical link manager layer 46 may also deal with overall link configuration and power management. While a software stack is depicted in FIG. 3, the present invention is in no way limited to any particular software architecture.

In some embodiments, a memory bus need not be connected to external pins on the package for the integrated memory components 18. Instead, the external manufacturing system 14 may provide programming data over the physical interface 24 and the application processor 22 then programs the memory components 18.

In one embodiment, the components 18 may be effectively stacked on one another and on top of an integrated circuit 26, including the application processor 22. This arrangement may result in more efficient communications between the various components. The components 18, the memory 20, and the processor 22, when implemented on different integrated circuits, may be packaged together in one integrated circuit package. However, the present invention is not limited to any type of stacking or packaging of the various elements.

Software 48 for facilitating the programming of the integrated memory components 18 may be stored on the application processor 22 in one embodiment. However, the software 48 may be located in the internal memory 20 or at any other location. In one embodiment, the software 48 is stored in non-volatile memory.

Figure 4:
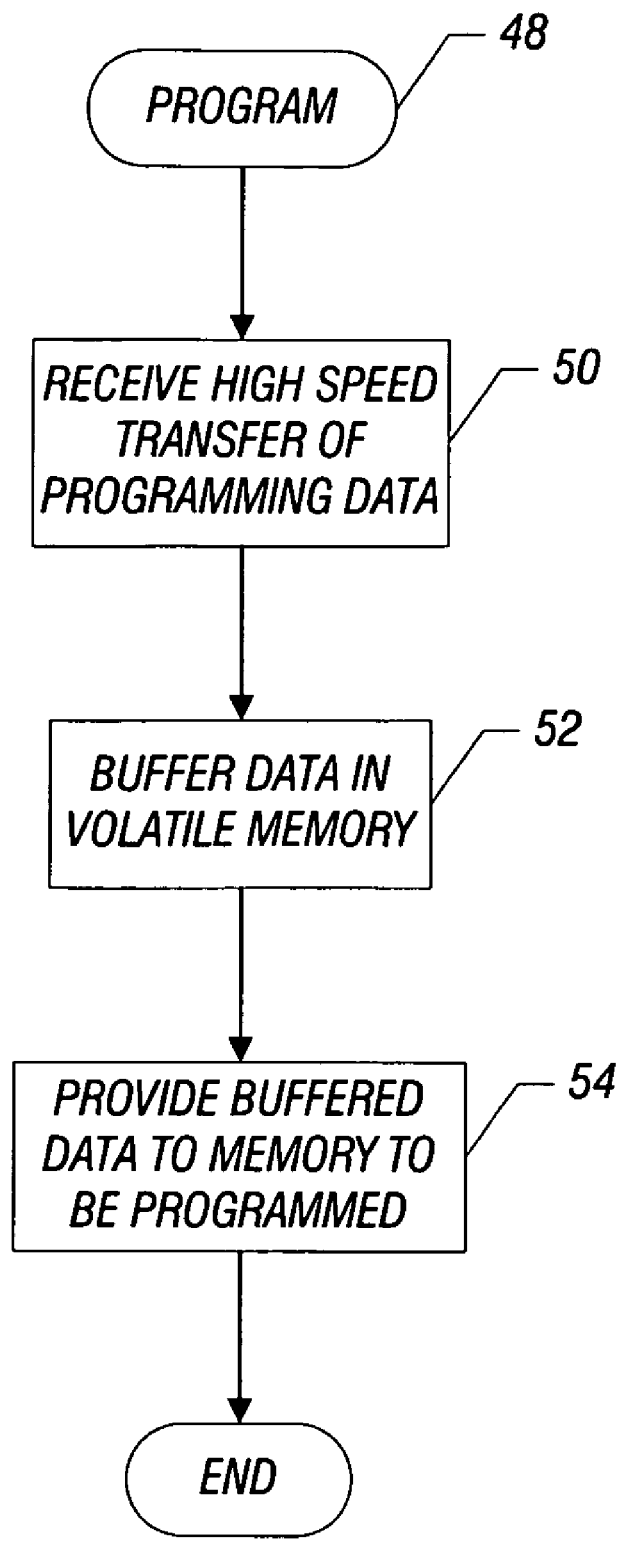
FIG. 4 is a flow chart for software for one embodiment of the present invention.

Referring to FIG. 4, the program software 48 begins by receiving high speed transfer of programming data from the memory programmer 16 over the interface 24 as indicated in block 50. The software 48 causes the application processor 22 to buffer the received data in a volatile memory as indicated in block 52. The volatile memory may be part of the internal memory 20 in one embodiment of the present invention. The buffer data is thereafter provided to the memory components 18 to be programmed as indicated in block 54. The provision of such data may be at a rate commensurate with the rate of programming of the integrated memory components 18. That rate may be significantly slower than the rate at which the data may be transferred from the memory programmer 16 across the interface 24 and processed by the processor 22 in some embodiments. Thus, in such embodiments, the processor 22 may transform the speed of data transferred to accommodate the integrated memory components 18, while at the same time allowing the memory programmer 16 to transfer the data quickly. Transferring the data quickly increases the manufacturing throughput.

Figure 5:
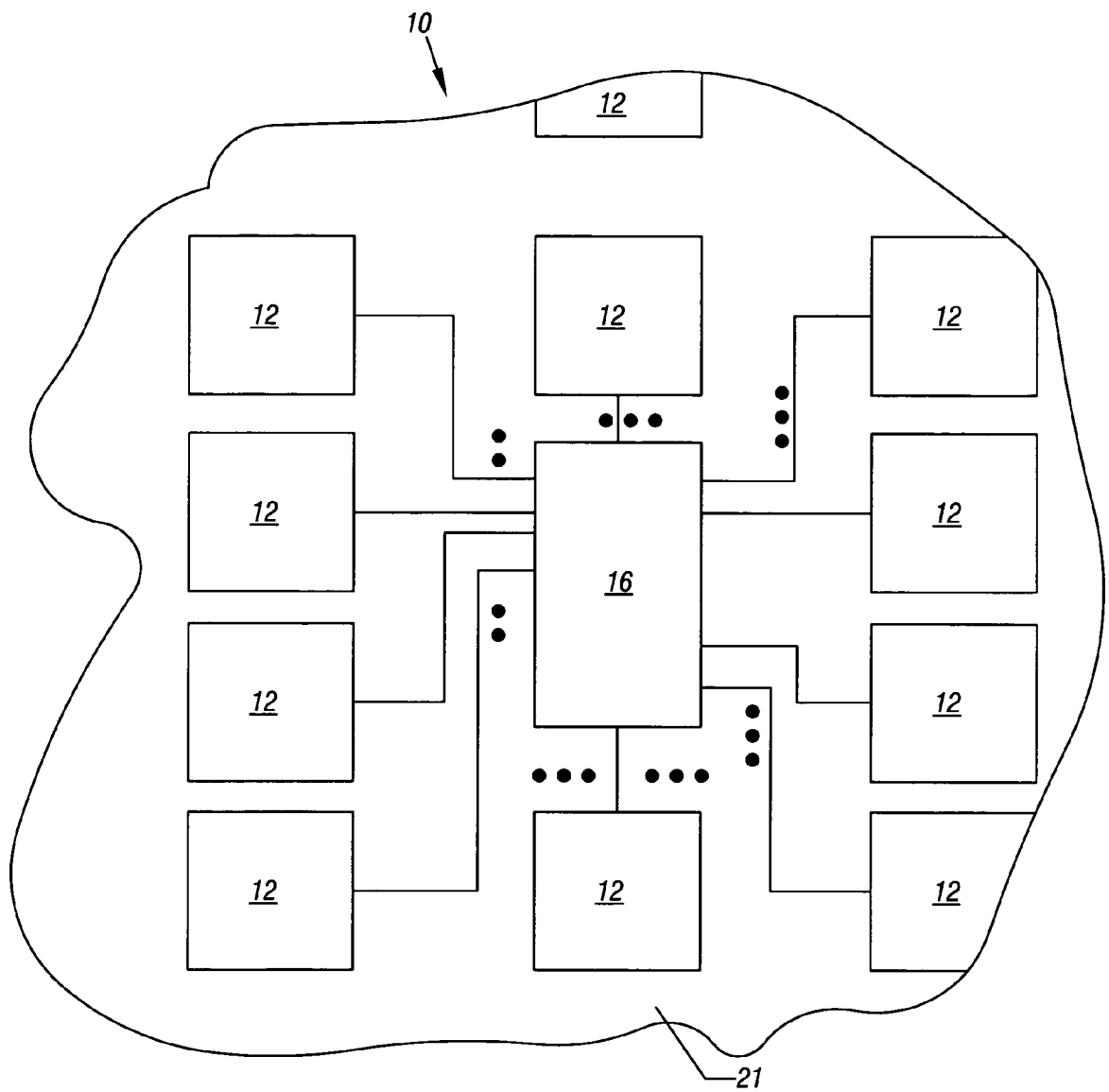
FIG. 5 is a partial top plan view of another embodiment of the present invention.

Referring to FIG. 5, in accordance with one embodiment of the present invention, the board or socket 21 may have received thereon a large number of multi-component packages 12, each including a processor 48 and integrated memory components 18. The packages 12 may receive power from the board or socket 21. Each processor 22 may be coupled by an appropriate electrical connection to the memory programmer 16.

In one embodiment of the present invention, the memory programmer 16 programs one or more of the packages 12 at a time. Data may be streamed to some number less than all of the packages 12 and then, once the programming data has been transferred, the memory programmer 16 may be free to move on to program other packages 12 on the board or socket 21.

Thus, in one embodiment of the present invention, the programming data may be transferred at a high speed from the programmer 16 for processing by the application processor 22. Thereafter, the memory programmer 16 may subsequently provide data to a different package 12. While the memory programmer 16 is continuing to access subsequent packages 12 and potentially thereafter, the processor 22 functions to transfer the buffered data to actually program the integrated memory components 18.

In other words, the programming of the integrated memory components 18 may proceed during and after the actual provision of data from the memory programmer 16. This may free the programmer 16 to move on to other packages 12 and, subsequently, to other boards or sockets 21 if need be. As a result, manufacturing throughput may be increased in some embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An article comprising a medium storing instructions that, if executed, enable a processor-based system to:
    transfer data from a memory programmer to a plurality of processors at a first data rate;
    buffer the data; and
    transfer the data from each of the plurality of processors to each of a plurality of memories, respectively, at a second data rate, wherein the second data rate is different from the first data rate.

2. The article of claim 1 further storing instructions that, if executed, enable the processor-based system to:
    transfer the data from each of the plurality of processors to each of the plurality of memories, respectively, at the second data rate while transferring data from the memory programmer to another plurality of processors at the first data rate.

3. The article of claim 1, wherein the second data rate is slower than the first data rate.

4. The article of claim 2 further storing instructions that, if executed, enable the processor-based system to:
    transfer data from a package including one of the plurality of processors to a separate package including one of the plurality of memories.

5. A system comprising:

means for transferring data from a memory programmer to a plurality of processors at a first data rate;

means for buffering the data; and means for transferring the data from each of the plurality of processors to each of a plurality of memories, respectively, at a second data rate, wherein the second data rate is different from the first data rate.

6. The system of claim 5 further comprising:

means for transferring the data from each of the plurality of processors to each of the plurality of memories, respectively, at the second data rate while transferring data from the memory programmer to another plurality of processors at the first data rate.

7. The system of claim 5, wherein the second data rate is slower than the first data rate.

8. The system of claim 6 further comprising:

means for transferring data from a package including one of the plurality of processors to a separate package including one of the plurality of memories.

\* \* \* \* \*